United States Patent [19]

Chappell et al.

[11] Patent Number: 4,835,419
[45] Date of Patent: May 30, 1989

[54] SOURCE-FOLLOWER EMITTER-COUPLED-LOGIC RECEIVER CIRCUIT

[75] Inventors: Barbara A. Chappell; Terry I. Chappell, both of Amawalk; Stanley E. Schuster, Granite Springs, all of N.Y.

[73] Assignee: International Business Machines Corporation, Armonk, N.Y.

[21] Appl. No.: 115,690

[22] Filed: Oct. 30, 1987

[51] Int. Cl.$^4$ ............... H03K 19/092; H03K 17/16; H03K 19/017
[52] U.S. Cl. .................................. 307/475; 301/443; 301/448; 301/451
[58] Field of Search ............... 307/443, 448, 451, 475

[56] References Cited

U.S. PATENT DOCUMENTS

| | | | |
|---|---|---|---|
| 4,096,398 | 1/1978 | Khaitan | 307/237 |
| 4,264,829 | 4/1981 | Misaizu | 307/450 |
| 4,316,106 | 2/1982 | Young et al. | 307/481 |
| 4,521,701 | 6/1985 | Reddy | 307/481 |
| 4,542,307 | 9/1985 | Baba | 307/481 |
| 4,554,469 | 11/1985 | Segawa et al. | 307/482 |

FOREIGN PATENT DOCUMENTS 0127424  7/1984  Japan .................. 307/443

OTHER PUBLICATIONS

IBM Technical Disclosure Bulletin Vol. 19, No. 8 Jan. 1977, Bipolar Logic Level to FET Logic Level Buffer Circuit, pp. 2953-2954, by S. C. Lewis et al.
Extended Abstract of the 17th Conference on Solid State Devices & Materials, Tokyo, 1985 pp. 53-56. "An ECL Compatible 64Kb FIPOS/CMOS Static RAM" by Y. Ohmori et al.
Electronics Special Report, Sep. 9, 1985 "Superfast ICs Herald New Supercomputer Era" by T. Manuel.

Primary Examiner—John S. Heyman
Assistant Examiner—M. R. Wambach
Attorney, Agent, or Firm—John J. Goodwin

[57] ABSTRACT

A circuit means for interfacing between small emitter-coupled-logic (ECL) circuit voltage levels and larger field effect transistor (FET) circuits voltage level. The circuit interface means includes a source-follower stage wherein a first transistor device is ratioed relative to a second transistor device, so that a high percentage of an input voltage level signal to the first transistor device appears at a node between the first and second transistor devices, having been level shifted downward by greater than or equal to an n-channel threshold voltage. The percentage is enhanced by applying the complement of the input voltage level signal to the gate of the second transistor device. A gain stage is connected to the source-follower stage and includes third and fourth transistor devices wherein gain is developed by applying the level shifted input signal to the source of the fourth transistor device and the complement of the input signal directly to the gate of the fourth transistor device. A compensation stage for the circuit may also be included.

12 Claims, 2 Drawing Sheets

SOURCE-FOLLOWER EMITTER-COUPLED-LOGIC RECEIVER CIRCUIT

BACKGROUND OF THE INVENTION

1. Field of the Invention

The present invention relates to receiver circuits responsive to small signal level signals such as emitter-coupled-logic (ECL) level signals for converting the small level signals to larger signal swings such as used for to FET logic levels, and more particularly, to an ECL receiver circuit including a source-follower stage.

2. Background Art

U.S. Pat. No. 4,264,829 issued Apr. 28, 1981 to Misaizu entitled MOS INVERTER-BUFFER CIRCUIT HAVING A SMALL INPUT CAPACITANCE and a continuation, U.S. Pat. No. 4,446,387 issued May 1, 1984, describes a circuit for preventing an input signal supplied to an input terminal from directly affecting an inverted signal derived at a node. An inverter stage of an inverter-buffer circuit composed of MOS transistors comprises two additional partial inverter stages between a buffer stage and a conventional inverter stage that serves as an input-side partial inverter stage. The buffer stage comprises an additional MOS transistor having a gate connected directly to the node in order to achieve a short switching delay.

Other prior art includes U.S. Pat. No. 4,096,398 issued June 20, 1978 to Khaitan entitled MOS OUTPUT BUFFER CIRCUIT WITH FEEDBACK and relating to a PMOS output buffer circuit which permits interfacing directly with TTL, CMOS and NMOS. A feedback circuit incorporated into the buffer acts to limit the drive current for negative potential output excursions. The feedback circuit is sensitive to device parameters that vary with processing so that the output characteristics can be set independently of process variables.

U.S. Pat. No. 4,316,106 issued Feb. 16, 1982 to Young et al entitled DYNAMIC RATIOLESS CIRCUITRY FOR RANDOM LOGIC APPLICATIONS describes a logic circuit for receiving an input signal and for generating a delayed output signal being clocked by first and second non-overlapping clock phases. The logic circuit includes a voltage supply, a precharge transistor interconnected to the voltage supply clocked by the first clock phase. A discharge transistor is interconnected to the precharge transistor thereby defining a first node and is clocked by the second clock phase to conditionally discharge the first node. An input logic circuit is interconnected to the discharge transistor, thereby defining a second node for providing a discharge path from the first node to a ground voltage potential, the input logic circuit is connected to receive the input signal. An output transistor is interconnected to the first node for generating the delayed output signal. The output transistor is clocked by the second clock phase. A capacitor is interconnected to the first node and the output transistor and is clocked by the second clock phase for maintaining the first node at a predetermined voltage level by a bootstrapping operation.

U.S. Pat. No. 4,521,701 issued June 4, 1985 to Reddy entitled HIGH-SPEED LOW-POWER DELAYED CLOCK GENERATOR describes a clock circuit for producing a high-level delayed clock output following an input clock employing an output transistor and pull-down transistor controlling an output node in response to the voltage on a drive node. The input node clock is applied to this drive node by a decoupling arrangement, consisting of two series transistors. The first transistor isolates the input charge on a holding node, and the second of the series transistors transfers the charge to the drive node after the desired delay. The output node is held at zero until after the delay, with no unwanted voltage rise, and no d.c. power loss. A large capacitive load can be driven.

U.S. Pat. No. 4,542,307 issued Sept. 17, 1985 to Baba entitled DOUBLE BOOTSTRAPPED CLOCK BUFFER CIRCUIT describes a buffer circuit having first and second bootstrap circuits. The first bootstrap circuit charges the gate of an output MOS transistor to a voltage above a supply voltage when an input signal has a first logic level. The gate of a precharging MOS transistor in the first bootstrap circuit is driven by the second bootstrap circuit so as to precharge a capacitor in the first bootstrap circuit to a voltage above the supply voltage when the input signal has a second logic level.

U.S. Pat. No. 4,554,469 issued Nov. 19, 1985 to Segawa et al entitled STATIC BOOTSTRAP SEMICONDUCTOR DRIVE CIRCUIT describes a semiconductor circuit having a static bootstrap circuit, which includes a first MOS transistor with an input signal supplied to the gate and having the current path connected between a voltage source terminal and a node, a second MOS transistor having the gate connected to receive an inverted form of the input signal after a delay time and having the current path connected between the node and a reference potential terminal and a capacitor connected between the gate of the first MOS transistor and the node. The semiconductor circuit also has a short pulse generator. The bootstrap circuit further includes a third MOS transistor having the current path connected between the output terminal of the short pulse generator and the node and with the input signal supplied to the gate and fourth and fifth MOS transistors having the respective gates connected to the gates of the first and second MOS transistors and the respective current paths connected in series between the voltage source terminal and reference potential terminal.

In *Electronics*, Sept. 9, 1985, at page 94 an article describes an ECL to CMOS interface which uses BIMOS, a mixture of CMOS and bipolar technology to manufacture a single memory chip. The multiple process steps of integrating bipolar and CMOS technologies is necessarily complex and expensive and thus undesirable.

Another example of a bipolar logic level to FET logic level interface circuit is described in *IBM Technical Bulletin*, Volume 19, No. 8, January 1977, pages 2953-2954. This circuit provides a clocked circuit for receiving input ECL or TTL logic levels. This circuit requires three timing signals to couple the logic signals on the input modes to higher voltages suitable for driving an FET array. No method for converting the timing signals from ECL levels to the required FET voltage levels is given.

An example of an ECL to CMOS interface circuit using only CMOS devices is described in the *Extended Abstracts of the 17th Conference on Solid State Devices and Materials*, Tokyo, 1985, pp. 53-56. This interface circuit uses an input stage to shift the ECL signal by an adjustable amount in order to drive a standard CMOS inverter.

In U.S. Pat. No. 4,645,954 entitled ECL TO FET INTERFACE CIRCUIT FOR FIELD EFFECT TRANSISTOR ARRAYS, issued Feb. 2, 1987 in the name of S. E. Schuster, an interface circuit for coupling bipolar logic circuit output signals to an FET logic array is described. The interface receives chip select signals and their complement on a dual-rail input line. A small signal amplifier comprising an FET amplifier having an input FET transistor connected through its source and gate to the dual-rail input terminals, converts the chip enable signal to a high level clocking signal. An FET dynamic sense amplifier receives a bipolar logic level to be converted to an FET logic level, and receives a reference level from the bipolar transistor logic circuit. Upon clocking of the dynamic sense amplifier by the small signal multiplier, the true and complementary FET logic levels corresponding to the input bipolar logic levels are provided by the dynamic sense amplifier.

In copending patent application entitled INTERFACE CIRCUIT INCLUDING A LEVEL SHIFTING AND MULTIPLYING CIRCUIT FOR AN INTERFACE CIRCUIT BETWEEN TRANSISTOR LOGIC LEVELS AND EFFECT TRANSISTOR LOGIC LEVELS, Ser. No. 06/825,420, filed Feb. 3, 1986 in the name of S. E. Schuster et al, field effect transistor (FET) circuits for converting input ECL transistor logic levels to FET logic levels are described. More particularly, an FET interface circuit including an enhancement device which converts either a dual-rail or a single-rail ECL chip select signal to an FET voltage level and single-rail ECL address and data-in signals to true and complement FET voltage levels is described for use in FET semiconductor memories.

SUMMARY OF THE INVENTION

It is an object of the present invention to provide an improved interface circuit for use as a circuit interface between the small signal networks such as used with emitter-coupled-logic (ECL) circuits and the larger signal swings used for digital field effect transistor circuits.

It is a more specific object of the invention to provide an improved CMOS source-follower ECL receiver circuit for use as an interface circuit.

A further object of the invention is to provide a CMOS source-follower ECL receiver circuit having a source-follower stage with two ratioed transistors to shift the input signal to the source of a third transistor and the complement of the input signal to the gate such that nearly twice the amplitude of the input signal is available for overdrive of the third transistor, thus providing high gain and speed for the circuit.

Still another object of the invention is to provide an embodiment of a CMOS source-follower ECL receiver circuit for dual-rail ECL levels and receiver embodiment including a compensation stage for detection of single-rail ECL signals.

DESCRIPTION OF THE PREFERRED EMBODIMENTS

Figure 1:
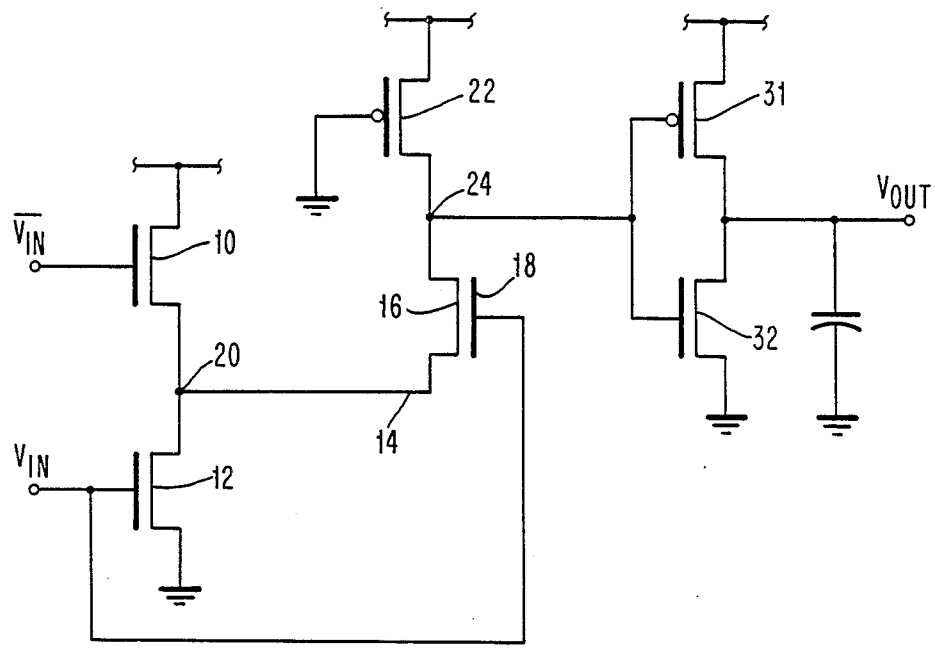
FIG. 1 is a schematic circuit diagram of an embodiment of a CMOS source-follower ECL receiver structure according to the principles of the present invention.

Referring to FIG. 1, a CMOS source-follower emitter coupled logic (ECL) receiver circuit is shown having a source-follower stage with two ratioed transistors 10,12 to shift the complement signal $\overline{VIN}$ of an input signal VIN to the source 14 of a third transistor 16, and having the input signal VIN to the gate of transistor 12 and to gate 18 of third transistor 16 such that nearly twice the amplitude of the signal $\overline{VIN}$ is available for overdrive of the third transistor 16, thus providing high gain and speed for the circuit.

In FIG. 1, transistors 10 and 12 form the source-follower stage. Transistors 10 and 12 have different device width to length ratios to provide conductance valves so that a high percentage of the signal $\overline{VIN}$, appears at node 20, having been level shifted downward by greater than or equal to an n-channel threshold voltage. This percentage is enhanced by applying the signal VIN to the gate of device 12.

In the next stage, referred to as the gain stage and formed by transistors 16 and 22, gain is developed by applying the level shifted complement $\overline{VIN}$ signal to the source 14 of device 16 and the VIN signal directly to the gate 18 of device 16.

Transistor 22 is width and length ratioed relative to device 16 to provide conductances so that when VIN=$\overline{VIN}$ the voltage on node 24 is at about one half the available swing or is centered in the window for switching the subsequent stage. Device 12 needs to be large enough relative to devices 16 and 22 so that a high percentage of the complement signal $\overline{VIN}$, appears at node 20 even when node 24 is at its lowest level.

Figure 2:
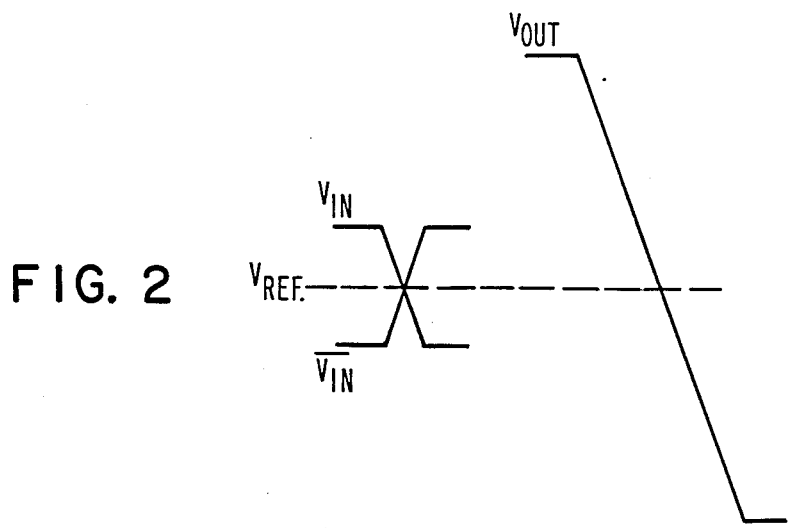
FIG. 2 is a schematic illustration of a waveform diagram of input voltage signals associated with the circuit of FIG. 1.

Given the foregoing description, the signal amplitude increase provided by the source-follower configuration can be seen by writing a simple equation for the overdrive voltage (VOD) to device 16 of FIG. 1. By the standard first-order textbook device equations, the VOD of device 16 can be defined as VOD=VG−VS−VTN where the gate 18 voltage is VG, the source 14 voltage is VS and device threshold is VTN. As is shown in FIG. 2, the input signal and its complement are assumed to swing relative to a constant voltage, VREF. If the signal amplitude (VIN) is in the direction to increase the current in device 16, then VG=VREF+VIN.

As previously described, the ratio of the conductances of devices 10 and 12 is designed so that the voltage at node 20 when VIN=$\overline{VIN}$=0 is a threshold voltage (VTN) plus some additional voltage (VLS) below the reference voltage VREF. As also previously described, the signal amplitude at node 20 is a high percentage (R) of the signal amplitude input to device 10 gate. If the signal amplitude applied to gate 18 of device 16 is written as VREF+VIN, then the complement signal applied to the gate of device 10 can be written as VREF−VIN. Therefore, the voltage at node 20 which is applied to source 14 is VS=VREF−VTN−VLS−RVIN. It follows that the VOD of device 18 for the ON case is VOD(ON)=−VREF+VIN−(VREF−VTN−VLS−RVIN)−VTN=VLS+VIN(1+R). Similarly, for the OFF case, VOD is VOD(OFF)=VREF−VIN−(−VREF−VTN−VLS+RVIN)−VTN=VLS−VIN(1+R). The value of R depends on the limitations on power and device sizes imposed by a particular application. However, values of >85% are readily achievable with reasonable specifications. Thus, close to twice the signal amplitude is available for the overdrive to device 16. This leads to the high gain and high speed characteristics of the circuit.

While the basic source-follower receiver circuit shown in FIG. 1 has adequate parameter variation tolerance for operation at dual-rail ECL levels, tolerance to voltage supply, p-device threshold, and n-device threshold shifts with the usual process and system specifications may not be adequate for detection of single-rail ECL levels under worst case conditions. However, with the addition of a compensation stage to the source-follower and gain stage as shown in FIG. 3, a large improvement in margins is achieved for detecting single-rail signals.

The compensation stage, which includes transistor devices 27, 28, 29 and 30, is simply a copy of the source-follower and gain stage shown in FIG. 1, but with the load device 30 (equivalent to gain stage device 22) diode-wired and the source-follower load device 28 (equivalent to source-follower stage device 12) effectively diode-wired. These diodes limit the swing on node 26 while keeping node 26 voltage close to the midpoint of the node 26 and node 24 swings. The input signals for the compensation stage are connected opposite to those for the source-follower and gain stage, thereby providing the correct direction of swing needed for driving the devices 12 and 22 in the source-follower and gain stage and improving that stage's gain. Any variations in supplies or thresholds that act to imbalance the gain stage also shift the node 26 signal so as to provide compensating drive to devices 12 and 22. Moreover, the node 26 bias voltage tends to keep devices 12 and 22 in the saturated regime of operation instead of in the resistive regime as for the uncompensated case, resulting in further gain improvement. The improvement in tolerance of threshold and supply variations with the compensation circuit costs a small degradation in tracking tolerances and in speed. The power in the compensation stage need not be as large as the power in the main amplifier, thereby containing the power cost for compensation.

Figure 3:
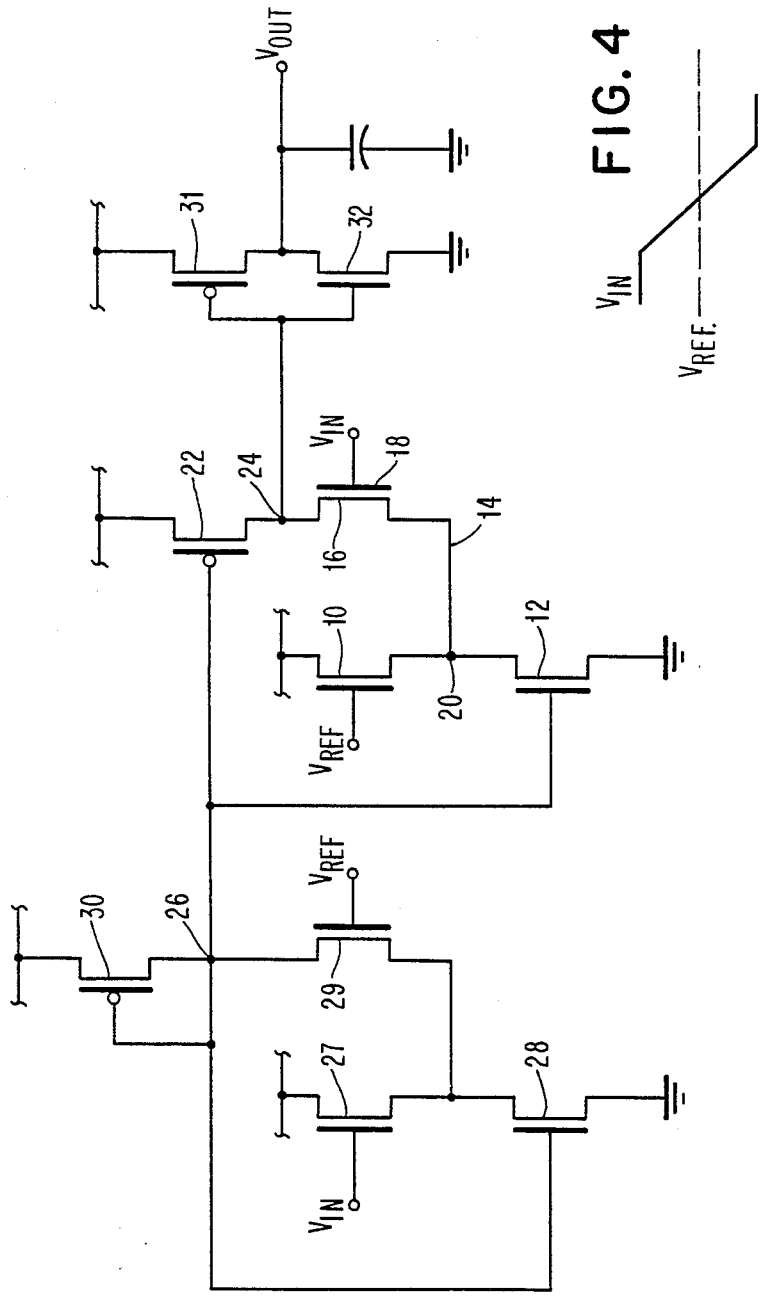
FIG. 3 is a schematic circuit diagram of another embodiment of a CMOS source-follower ECL receiver structure including a bias compensation feature for the detection of single-rail ECL signals according to the principles of the present invention.
Figure 4:
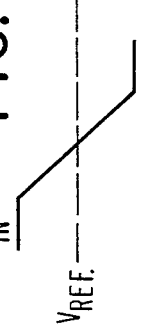
FIG. 4 is a schematic illustration of a waveform diagram of input voltage signals associated with the circuit of FIG. 3.

The final stage in FIGS. 1 and 3 is a standard inverter consisting of devices 31 and 32. Full on-chip levels are available at the output, VOUT. The compensation for parameter variations in the FIG. 3 circuit is well matched to the inverter final stage.

A number of modifications will be obvious to one skilled in the art. For example, the basic amplifier described and shown in FIG. 1 could be biased (device 22 and device 12) with standard bias compensation schemes, or with power supply or reference voltage biasing or device 22 of FIG. 1 could be driven directly by the input signal (VIN) as is shown for device 12. For another example, the final stage could be a more complex stage than a simple inverter, such as a level-shifting stage. Alternatively, devices could be added to the inverter to perform logic functions using any of the well known logical ANDing or ORing circuits. Another major but obvious modification is to build the dual of the circuit; that is, make each n-device a p-device, and visa versa. Likewise, the basic amplifier circuit could be adapted to an all enhancement or enhancement/depletion technology by using standard load device configurations.

Having thus described our invention, what we claim as new and desire to secure by Letters Patent is:

1. A circuit means for providing an interface between small signal level circuits and circuits having large signal level swings comprising:

a source-follower receiver stage including first and second transistor devices connected in series between a voltage source and a ground potential, said first and second transistor devices being directly connected in series at a first node and having different respective conductances for providing a selected ratio of conductance, said first one of said first and second transistor devices having a gate electrode for receiving a first input level signal and providing a high percentage of said first input level signal at said first node, and said second one of said first and second transistor devices having a gate electrode for receiving a second level signal, and a gain receiver stage including third and fourth transistor devices connected in series between said voltage source and said first node, said third and fourth transistor devices being connected in series together at a second node, said fourth transistor device having a source electrode connected to said first node for receiving said high percentage of said first input level signal and a drain electrode directly connected to said third transistor at said second node, said third and fourth transistor devices having respective conductances for providing a high gain output signal at said second node in response to said high percentage of said first input level signal at said first node, and wherein said fourth transistor device includes a gate electrode for receiving a gain control signal.

2. A circuit means according to claim 1 wherein said different respective conductance of said first and second transistor devices are provided by the device widths and lengths of said first and second transistor devices.

3. A circuit means according to claim 1 wherein said gate electrode of said second transistor devices is connected to a source of bias signal such that said conductance of said second transistor device is substantially lower than said conductance of said first transistor device.

4. A circuit means according to claim 3 wherein said gate electrode of said third transistor device is connected to a source of bias signal such that said conductance of said third transistor device is substantially lower than said first transistor device.

5. A circuit means according to claim 1 wherein said first input level signal is a first input voltage level signal and said second level signal received by said gate electrodes of said second and forth transistor devices is the complement of said first input voltage level signal.

6. A circuit means according to claim 1 wherein said first input level signal is a reference level signal and said second level signal is an input signal relative to said reference level of said first input signal.

7. A circuit means according to claim 1 further including a compensation stage having fifth and sixth transistor devices connected in series between said voltage source and said ground potential, said fifth and sixth transistor devices being connected in series at a third node and having different respective device widths for providing a selected ratio of conductance, said fifth transistor device having a gate electrode for receiving said gain control signal and providing a high percentage of said compensation input level signal at said third node, said compensation stage further including seventh and eighth transistor devices connected in series between said voltage source and said third node, said seventh and eighth transistor devices being connected in series together at a fourth node said eight transistor device having a source electrode connected to said third node for receiving said high percentage of said second input level signal, said seventh and eighth transistor devices having respective conductances similar to that for said third and fourth transistor devices, and wherein said fourth node is connected to said gate electrode of said sixth and seventh transistor devices and to said gate electrode of said second transistor device to provide said second level signal thereto.

8. A circuit means according to claim 1 further including an inverter circuit connected to said second node.

9. A circuit means according to claim 1 wherein said first and second transistor devices have device width-to-length ratios which provide conductance values in a ratio to shift said input level signal to said source electrode of said fourth transistor device.

10. A circuit means according to claim 7 further including an inverter circuit connected to said second node.

11. A circuit according to claim 1 wherein said gain control signal is said second level signal and said gate electrode of said fourth transistor device is for receiving said second level signal.

12. A circuit according to claim 11 wherein said gate electrode of said fourth transistor device is connected to said gate electrode of said second one of said first and second transistor devices for receiving said second level signal.

* * * * *